(12) United States Patent
Kondoh et al.

(10) Patent No.: US 8,466,468 B2
(45) Date of Patent: Jun. 18, 2013

(54) ORGANIC EL DISPLAY PANEL AND METHOD OF MANUFACTURING THE SAME

(75) Inventors: Tetsuro Kondoh, Osaka (JP); Shinya Ono, Osaka (JP)

(73) Assignee: Panasonic Corporation, Osaka (JP)

( * ) Notice: Subject to any disclaimer, the term of this patent is extended or adjusted under 35 U.S.C. 154(b) by 62 days.

(21) Appl. No.: 13/217,564

(22) Filed: Aug. 25, 2011

(65) Prior Publication Data

US 2012/0001186 A1    Jan. 5, 2012

Related U.S. Application Data

(63) Continuation of application No. PCT/JP2010/004372, filed on Jul. 5, 2010.

(51) Int. Cl.
| H01L 23/04 | (2006.01) |
| H01L 31/036 | (2006.01) |
| H01L 35/24 | (2006.01) |
| H01L 33/00 | (2010.01) |
| H01L 51/00 | (2006.01) |

(52) U.S. Cl.
USPC .................... 257/59; 257/40; 257/88; 257/72

(58) Field of Classification Search
USPC ............. 257/59, 40, 72, 88, 89, 79, 642, 643, 257/759, 443
See application file for complete search history.

(56) References Cited

U.S. PATENT DOCUMENTS 5,294,869 A * 3/1994 Tang et al. .................... 313/504
5,443,922 A   8/1995 Nishizaki et al.

(Continued)

FOREIGN PATENT DOCUMENTS

JP   5-163488      6/1993
JP   2003-022035   1/2003

(Continued)

OTHER PUBLICATIONS

International Search Report in PCT/JP2010/004372, dated Oct. 2, 2010.

(Continued)

*Primary Examiner* — Chuong A. Luu
(74) *Attorney, Agent, or Firm* — Greenblum & Bernstein, P.L.C.

(57) ABSTRACT

A display panel and method of manufacturing a display panel. A plurality of contact holes penetrate through an interlayer insulation film and have wiring lines connecting first electrode plates and second electrode plates with a thin-film transistor layer. The first electrode plates and the second electrode plates each include at least one concavity. The at least one concavity included in each of the first and second electrode plates coincide with the plurality of contact holes. A total volume of the at least one concavity in any of the first electrode plates is larger than a total volume of the at least one concavity in any of the second electrode plates, while a volume of a portion of the first organic functional layer corresponding to any of the first electrode plates at least approximates a volume of the second organic functional layer corresponding to any of the second electrode plates. A portion of the first organic functional layer entered into the at least one concavity in any of the first electrode plates is larger than a portion of the second organic functional layer entered into the at least one concavity in any of the second electrode plates, so that in locations other than the at least one concavity in the first electrode plates and the second electrode plates, the first organic functional layer is thinner than the second organic functional layer.

18 Claims, 11 Drawing Sheets

Cross-section diagram (A-A')

U.S. PATENT DOCUMENTS

| | | | |
|---|---|---|---|
| 6,309,801 B1 * | 10/2001 | Meijer et al. | 430/313 |
| 6,815,903 B2 | 11/2004 | Nakanishi | |
| 7,754,275 B2 | 7/2010 | Mitsuhashi et al. | |
| 8,076,704 B2 * | 12/2011 | Lee et al. | 257/294 |
| 2003/0146710 A1 | 8/2003 | Nakanishi | |
| 2007/0269621 A1 | 11/2007 | Mitsuhashi et al. | |
| 2011/0198623 A1 * | 8/2011 | Matsushima | 257/88 |
| 2011/0272677 A1 | 11/2011 | Takeuchi | |

FOREIGN PATENT DOCUMENTS

| | | |
|---|---|---|
| JP | 2003-241683 | 8/2003 |
| JP | 2007-311237 | 11/2007 |
| JP | 2010-097697 | 4/2010 |

OTHER PUBLICATIONS

U.S. Appl. No. 13/205,773 to Seiji Nishiyama, which was filed on Aug. 9, 2011.

U.S. Appl. No. 13/205,765 to Tetsuro Kondoh et al., which was filed on Aug. 9, 2011.

U.S. Appl. No. 13/205,778 to Kenji Harada et al., which was filed on Aug. 9, 2011.

U.S. Appl. No. 13/205,748 to Kenji Harada et al., which was filed on Aug. 9, 2011.

* cited by examiner

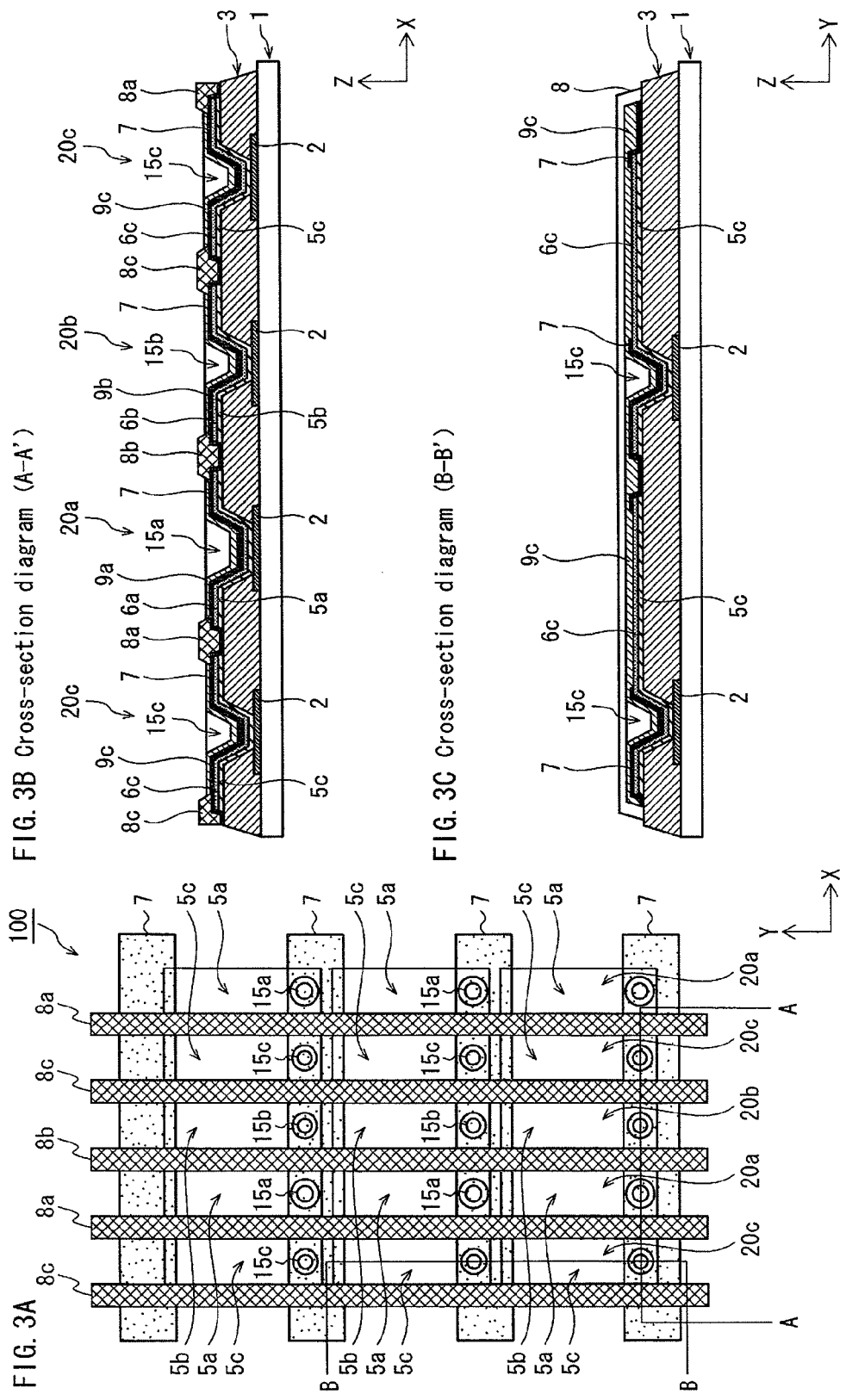

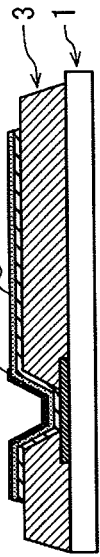
FIG. 4A Formation of TFT layer
FIG. 4B Formation of planarization film
FIG. 4C Formation of anode plate
FIG. 4D Formation of hole injection layer
FIG. 4E Formation of pixel defining layer
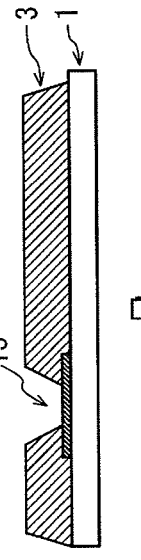
FIG. 4F Formation of banks
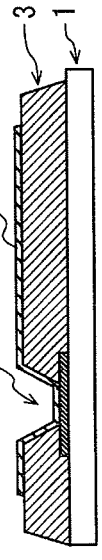
FIG. 4G Formation of inter layer

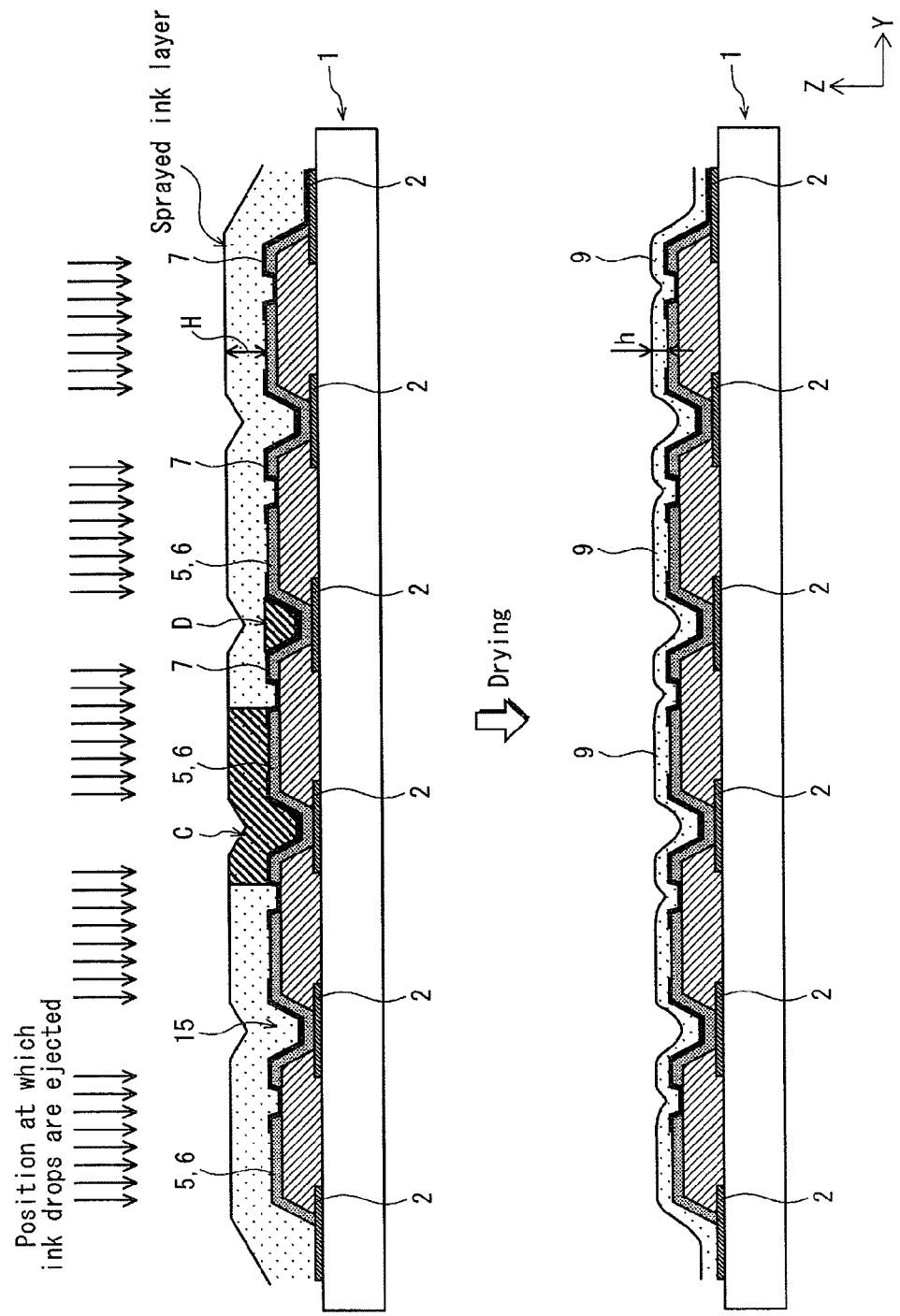

US 8,466,468 B2

ORGANIC EL DISPLAY PANEL AND METHOD OF MANUFACTURING THE SAME

CROSS REFERENCE TO RELATED APPLICATION

This is a continuation application of PCT Application No. PCT/JP2010/004372 filed Jul. 5, 2010, designating the United States of America, the disclosure of which, including the specification, drawings and claims, is incorporated herein by reference in its entirety.

FIELD OF THE INVENTION

The present invention relates to luminescent display panels containing light-emitting elements and to a method of manufacturing the same, and in particular to organic electroluminescence (hereinafter, "organic EL") display panels containing a matrix of organic EL elements.

DESCRIPTION OF THE RELATED ART

In recent years, organic EL display panels that have a plurality of organic EL elements in rows above a substrate have been commercialized as small electronic displays. Each organic EL element is a light-emitting element with the following basic structure. A light-emitting layer that includes organic light emitting material is disposed between a pair of electrodes, i.e. an anode and a cathode. When driven, voltage is impressed between a pair of electrodes, and holes injected into the light-emitting layer from the anode recombine with electrons injected into the light-emitting layer from the cathode. The organic EL element is driven by the current produced during this recombination.

Since each organic EL element in the organic EL display panel emits light, the light from the display panel is highly visible. Furthermore, each organic EL element is a complete solid state device and thus has excellent impact resistance.

In an organic EL display panel, typically a light-emitting layer is partitioned in each EL element by banks (walls) formed from insulating material. These banks define the shape of the light-emitting layer. Between the anode and the light-emitting layer, organic layers are provided as necessary, such as a hole-injection layer, hole transporting layer, or hole injection and transporting layer. An electron injection layer, electron transport layer, or electron injection and transporting layer may also be provided between the cathode and the light-emitting layer as necessary.

In a full-color organic EL display panel, such organic EL elements are formed into sub-pixels whose color is R, G, or B. Three adjacent RGB sub-pixels together constitute one pixel.

In order to form the light-emitting layer or charge injection layer in each organic EL element, banks are formed on the substrate to partition adjacent organic EL elements. Subsequently, an inkjet or other wet method is generally used to spray ink containing high-polymer material or small molecules that are suitable for thin-film formation. With such a wet method, it is relatively easy to form the organic layer or light-emitting layer even in large panels.

In a typical inkjet method (see Patent Literature 1), the substrate on which ink is to be sprayed is first placed on a work table. While inkjet heads are moved across the substrate in any direction of the matrix of elements therein, drops of a solution (hereinafter simply "ink") are ejected through each nozzle into the region for forming each element as defined by the banks on the substrate. The ink contains organic material and solvent that are for forming the organic layer, light-emitting layer, etc.

The ink that is typically used for forming the light-emitting layer differs by color. The ink used for forming the organic layer, however, is the same for all colors.

When manufacturing an organic EL panel in this way, it is generally necessary to ensure that the characteristics of organic EL elements of the same color are uniform. Therefore, when spraying ink via the inkjet method by providing each pixel with drops of ink from the nozzle, the same number of drops of ink is ejected into each element. Ink is thus ejected uniformly into the region for forming each element, which ensures that the film thickness of the organic layer is the same in all of the regions for forming elements of the same color, and that the film thickness of the light-emitting layer is also the same in all such regions.

PATENT LITERATURE

Patent Literature 1: Japanese Patent Application Publication No. 2003-241683

SUMMARY OF THE INVENTION

The film thickness of the organic layer that improves luminous efficiency of each organic EL element depends on the wavelength of the luminescent color.

In other words, the wavelengths of red, green, and blue light differ, causing the optimal path length (resonance condition) inside each organic EL element to differ. Therefore, in order to improve luminous efficiency, it is preferable to finely adjust the film thickness of the organic layer in the sub-pixel of each luminescent color to match the wavelength of the color.

When the wet method is used to actually form the organic layer, however, it is difficult to finely adjust the film thickness of the organic layer in the sub-pixel of each color. Specifically, as described above the ink that includes material for the organic layer is set to be the same for all colors, and the amount of ink provided to each sub-pixel for forming the organic layer is set to be constant. For example, when spraying ink for the organic layer by the inkjet method, the number of drops of ink ejected into the regions for forming the organic EL element of each color is set to be the same, and the volume of each drop of ink ejected from the nozzle is set to be constant. It is plausible to adjust the film thickness of the organic layer by changing the number of drops of ink dripped into the sub-pixel of each color when using the inkjet method. Since the amount of ink provided to each sub-pixel can only be varied by changing the number of drops of ink, however, it is difficult with this approach to finely adjust the film thickness of the organic layer in the sub-pixel of each color.

The present invention has been conceived in light of the above problems, and it is an object thereof to make it easy to finely adjust the film thickness of the organic layer for each luminescent color in an organic EL display panel when forming the organic layer via the wet method, and to provide an organic EL display panel that therefore has excellent luminous efficiency.

In order to solve the above problems, an organic EL display panel according to an aspect of the present invention comprises: a first electrode plate group including a plurality of first electrode plates that correspond to a first color and are arranged in a line; a second electrode plate group including a plurality of second electrode plates that correspond to a second color and are arranged in a line adjacent to the first electrode plate group; a first bank along an edge of the first electrode plate group opposite the second electrode plate group; a second bank between the first electrode plate group and the second electrode plate group along respective edges thereof; a third bank along an edge of the second electrode plate group opposite the first electrode plate group; a first organic functional layer between the first bank and the second bank and above the first electrode plate group; a second organic functional layer between the second bank and the third bank and above the second electrode plate group; and a counter electrode disposed to cover both the first organic functional layer and the second organic functional layer, wherein each of the first electrode plates and each of the second electrode plates includes one or more concavities, the total volume of the one or more concavities in any of the first electrode plates is larger than the total volume of the one or more concavities in any of the second electrode plates, the volume of a portion of the first organic functional layer corresponding to any of the first electrode plates is equal to, or an approximation of, the volume of the second organic functional layer corresponding to any of the second electrode plates, and a portion of the first organic functional layer that has entered into the one or more concavities in any of the first electrode plates is larger than a portion of the second organic functional layer that has entered into the one or more concavities in any of the second electrode plates, so that in locations other than the one or more concavities in the first electrode plates and the second electrode plates, the first organic functional layer is thinner than the second organic functional layer.

Alternatively, a concavity may be provided on each first electrode plate, the volume of the first organic functional layer on each first electrode plate may be equal to, or an approximation of, the volume of the second organic functional layer on each second electrode plate, and a portion of the first organic functional layer may have entered into the concavity in each of the first electrode plates, so that in locations other than the concavity, the first organic functional layer is thinner than the second organic functional layer on the second electrode plates.

In this context, stating that the volume of a portion of the first organic functional layer on any first electrode plate is "equal to, or an approximation of," the volume of a portion of the second organic functional layer on any second electrode plate refers to the volume of the first organic functional layer and the volume of the second organic functional layer being substantially equal. Numerically speaking, the difference in volume between the first and second organic functional layers is within a range of 5%, inclusive, of the volume of the first organic functional layer.

A method of manufacturing an organic EL display panel according to another aspect of the present invention comprises the steps of: a first step of forming a first electrode plate group including a plurality of first electrode plates that correspond to a first color and are arranged in a line; a second step of forming a second electrode plate group including a plurality of second electrode plates that correspond to a second color and are arranged in a line adjacent to the first electrode plate group; a third step of forming a first bank along an edge of the first electrode plate group opposite the second electrode plate group; a fourth step of forming a second bank between the first electrode plate group and the second electrode plate group along respective edges thereof; a fifth step of forming a third bank along an edge of the second electrode plate group opposite the first electrode plate group; a sixth step of forming a first organic functional layer between the first bank and the second bank and above the first electrode plate group; a seventh step of forming a second organic functional layer between the second bank and the third bank and above the second electrode plate group; and an eighth step of forming a counter electrode disposed to cover both the first organic functional layer and the second organic functional layer, wherein the first step includes forming one or more concavities on each of the first electrode plates, the second step includes forming one or more concavities on each of the second electrode plates, the total volume of the one or more concavities in any of the first electrode plates is larger than the total volume of the one or more concavities in any of the second electrode plates, the volume of a portion of the first organic functional layer corresponding to any of the first electrode plates is equal to, or an approximation of, the volume of the second organic functional layer corresponding to any of the second electrode plates, and a portion of the first organic functional layer that enters into the one or more concavities in any of the first electrode plates is larger than a portion of the second organic functional layer that enters into the one or more concavities in any of the second electrode plates, so that in locations other than the one or more concavities in the first electrode plates and the second electrode plates, the first organic functional layer is thinner than the second organic functional layer.

Alternatively, in the first step, a concavity may be provided on each first electrode plate, the volume of the first organic functional layer formed in the sixth step may be equal to, or an approximation of, the volume of the second organic functional layer formed in the seventh step, and a portion of the first organic functional layer may enter into the concavity in each of the first electrode plates, so that in locations other than the concavity, the first organic functional layer is formed thinner than the second organic functional layer on the second electrode plates.

In the above aspects, the volume of the one or more concavities formed in each first electrode plate is changed. As a result, when the first organic functional layer is formed on each first electrode plate by the wet method, the amount of ink entering the corresponding concavities changes, thereby changing the film thickness of the first organic functional layer in locations of the first electrode plate other than the one or more concavities. Similarly, the volume of the one or more concavities formed in each second electrode plate is changed so that, when the second organic functional layer is formed on each second electrode plate by the wet method, the amount of ink entering the corresponding concavities changes, thereby changing the film thickness of the second organic functional layer in locations of the second electrode plate other than the one or more concavities.

The volume of the one or more concavities formed on each first electrode plate and second electrode plate can be adjusted in finer increments than the volume of one drop of ink ejected by the nozzle.

Accordingly, by finely adjusting the volume of the one or more concavities in the first electrode plate and the second electrode plate, it is easy to finely adjust both the film thickness of the first organic functional layer in locations of the first electrode plate other than the one or more concavities and the film thickness of the second organic functional layer in locations of the second electrode plate other than the one or more concavities.

It is therefore easy to finely adjust the film thickness of the organic layer in the sub-pixel of each luminescent color to match the wavelength of the color, making it easy to manufacture a light-emitting display panel with excellent luminous efficiency. Improving luminous efficiency also contributes to reducing power consumption.

BRIEF DESCRIPTION OF THE DRAWINGS

FIG. 3A is a plan view showing the structure of the display panel 100, FIG. 3B is a cross-section diagram from A to A in FIG. 3A, and FIG. 3C is a cross-section diagram from B to B in FIG. 3A;

FIGS. 4A-4G are an overall illustration of a method of manufacturing the display panel 100;

FIG. 5 is a schematic cross-section diagram showing conditions immediately after spraying ink for forming an organic layer on a substrate;

DETAILED DESCRIPTION OF EMBODIMENTS

<Aspects of the Invention>

Figure 1:
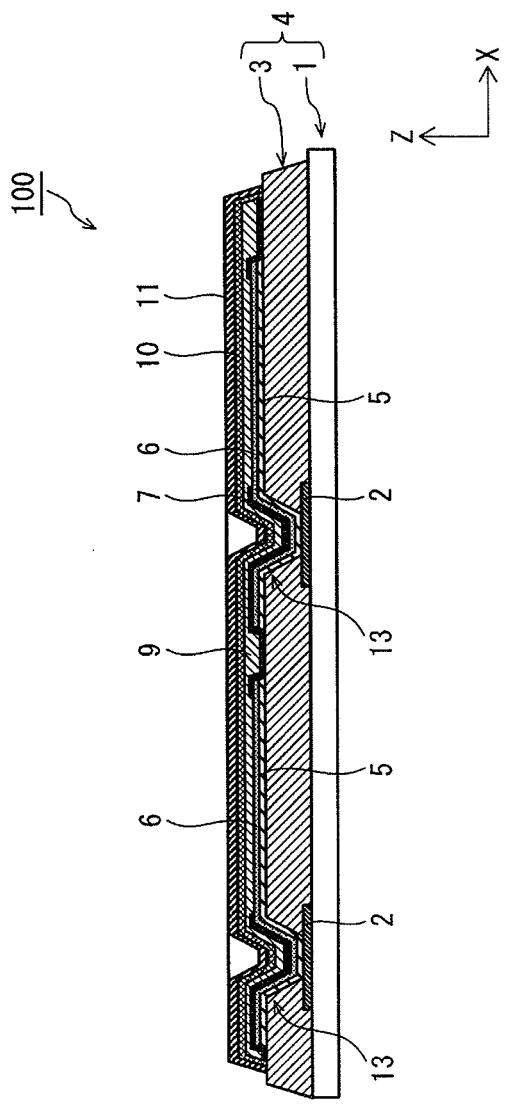
FIG. 1 is a cross-section diagram schematically showing the structure of a display panel 100 according to Embodiment 1.

An organic EL display panel according to an aspect of the present invention comprises: a first electrode plate group including a plurality of first electrode plates that correspond to a first color and are arranged in a line; a second electrode plate group including a plurality of second electrode plates that correspond to a second color and are arranged in a line adjacent to the first electrode plate group; a first bank along an edge of the first electrode plate group opposite the second electrode plate group; a second bank between the first electrode plate group and the second electrode plate group along respective edges thereof; a third bank along an edge of the second electrode plate group opposite the first electrode plate group; a first organic functional layer between the first bank and the second bank and above the first electrode plate group; a second organic functional layer between the second bank and the third bank and above the second electrode plate group; and a counter electrode disposed to cover both the first organic functional layer and the second organic functional layer, wherein each of the first electrode plates and each of the second electrode plates includes one or more concavities, the total volume of the one or more concavities in any of the first electrode plates is larger than the total volume of the one or more concavities in any of the second electrode plates, the volume of a portion of the first organic functional layer corresponding to any of the first electrode plates is equal to, or an approximation of, the volume of the second organic functional layer corresponding to any of the second electrode plates, and a portion of the first organic functional layer that has entered into the one or more concavities in any of the first electrode plates is larger than a portion of the second organic functional layer that enters into the one or more concavities in any of the second electrode plates, so that in locations other than the one or more concavities in the first electrode plates and the second electrode plates, the first organic functional layer is thinner than the second organic functional layer.

According to the above structure, by finely adjusting the volume of the one or more concavities in the first electrode plate and the second electrode plate, it becomes easy to finely adjust both the film thickness of the first organic functional layer in locations of the first electrode plate other than the one or more concavities and the film thickness of the second organic functional layer in locations of the second electrode plate other than the one or more concavities. Therefore, it is easy to finely adjust the film thickness of the organic layer to match the wavelength of each luminescent color, which contributes to manufacturing a light-emitting display panel with excellent light-emitting characteristics.

In the method of manufacturing an organic EL display panel according to another aspect of the present invention, the first step includes forming one or more concavities on each of the first electrode plates; the second step includes forming one or more concavities on each of the second electrode plates; the total volume of the one or more concavities in any of the first electrode plates is larger than the total volume of the one or more concavities in any of the second electrode plates, the volume of a portion of the first organic functional layer corresponding to any of the first electrode plates is equal to, or an approximation of, the volume of the second organic functional layer corresponding to any of the second electrode plates, and a portion of the first organic functional layer that enters into the one or more concavities in any of the first electrode plates is larger than a portion of the second organic functional layer that enters into the one or more concavities in any of the second electrode plates, so that in locations other than the one or more concavities in the first electrode plates and the second electrode plates, the first organic functional layer is thinner than the second organic functional layer.

According to the above structure, by finely adjusting the volume of the one or more concavities in the first electrode plate and the second electrode plate, it becomes easy to finely adjust both the film thickness of the first organic functional layer in locations of the first electrode plate other than the one or more concavities and the film thickness of the second organic functional layer in locations of the second electrode plate other than the one or more concavities. Therefore, it is easy to finely adjust the film thickness of the organic layer to match the wavelength of each luminescent color, which contributes to manufacturing a light-emitting display panel with excellent light-emitting characteristics.

In the above structure, a TFT layer may be provided below the first electrode plate group and the second electrode plate group, an interlayer insulation film may be layered between (i) the first electrode plate group and the second electrode plate group and (ii) the TFT layer, and a plurality of contact holes may penetrate through the interlayer insulation film and have wiring lines connecting the first electrode plates and the second electrode plates with the TFT layer. Furthermore, the one or more concavities included in each of the first electrode plates and each of the second electrode plates may coincide with the contact holes. Furthermore, the TFT layer has SD electrodes, and an area of any of the first electrode plates in contact through one of the contact holes with an SD electrode may be equal to (or an approximation of) an area of any of the second electrode plates in contact through one of the contact holes with an SD electrode, and the volume of the portion of the first organic functional layer that has entered into the one or more concavities provided in any of the first electrode plates may be larger than the portion of the volume of the second organic functional layer that has entered into the one or more concavities provided in any of the second electrode plates.

Each concavity in the first electrode plates and the second electrode plates may be a circular truncated cone, a diameter at the top of the concavity being larger than a diameter at the bottom of the concavity, and the diameter at the top of each of the one or more concavities in any of the first electrode plates may be larger than the diameter at the top of each of the one or more concavities in any of the second electrode plates so that the total volume of the one or more concavities in any of the first electrode plates is larger than the total volume of the one or more concavities in any of the second electrode plates.

The diameter at the bottom of each of the one or more concavities in any of the first electrode plates may be larger than the diameter at the bottom of each of the one or more concavities in any of the second electrode plates.

Alternatively, the diameter at the bottom of each of the one or more concavities in any of the first electrode plates may be equal to, or an approximation of, the diameter at the bottom of each of the one or more concavities in any of the second electrode plates (an "approximation" referring to the difference in diameter being within 5% of the diameter).

A first pixel defining layer may cover the one or more concavities in each of the first electrode plates, with the first organic functional layer being formed above the first pixel defining layer, and a second pixel defining layer may cover the one or more concavities in each of the second electrode plates, with the second organic functional layer being formed above the second pixel defining layer.

The first organic functional layer may be continuous above the first electrode plate group due to ink drops of a predetermined volume being sprayed via an inkjet method, and the second organic functional layer may be continuous above the second electrode plate group due to ink drops of the predetermined volume being sprayed via the inkjet method, so that the volume of a portion of the first organic functional layer corresponding to any of the first electrode plates is equal to, or an approximation of, the volume of the second organic functional layer corresponding to any second electrode plate.

With this structure, the thickness of the ink is set to a thickness between the thickness when n drops (n being a natural number) and when n+1 drops of ink are sprayed, unlike when no concavity is provided. Accordingly, the organic functional layer that forms by drying the ink is formed to a thickness that is between the thickness when n drops and when n+1 drops of ink are sprayed.

In the above aspect, the number of the concavities included in each of the first electrode plates may be larger than the number of the concavities included in each of the second electrode plates, and the volume of a portion of the first organic functional layer that has entered all of the concavities in any of the first electrode plates may be larger than the volume of a portion of the second organic functional layer that has entered all of the concavities in any of the second electrode plates.

The above aspect may further comprise: a third electrode plate group including a plurality of third electrode plates that correspond to a third color and are arranged in a line adjacent to the second electrode plate group, with the third bank therebetween; a fourth bank along an edge of the third electrode plate group opposite the second electrode plate group; a third organic functional layer between the third bank and the fourth bank and above the third electrode plate group; a third organic light emitting layer that emits light of a third color provided above the third organic functional layer; a TFT layer provided below the first electrode plate group, the second electrode plate group, and the third electrode plate group; an interlayer insulation film layered between (i) the first electrode plate group, the second electrode plate group, and the third electrode plate group and (ii) the TFT layer; and a plurality of contact holes penetrating through the interlayer insulation film and having wiring lines connecting the first electrode plates, the second electrode plates, and the third electrode plates with the TFT layer, wherein the counter electrode is provided above the third organic functional layer, the one or more concavities in each of the first electrode plates, second electrode plates, and third electrode plates coincide with the contact holes, the total volume of the one or more concavities in any of the first electrode plates is larger than the total volume of the one or more concavities in any of the second electrode plates and the one or more concavities in any of the third electrode plates, the volume of a portion of the first organic functional layer corresponding to any of the first electrode plates is equal to, or an approximation of, the volume of the second organic functional layer corresponding to any of the second electrode plates and to the volume of the third organic functional layer corresponding to any of the third electrode plates, and a portion of the first organic functional layer that has entered into the one or more concavities in any of the first electrode plates is larger than a portion of the second organic functional layer that has entered into the one or more concavities in any of the second electrode plates and larger than a portion of the third organic functional layer that has entered into the one or more concavities in any of the third electrode plates, so that in locations other than the one or more concavities in the first electrode plates, the second electrode plates, and the third electrode plates, the first organic functional layer is thinner than the second organic functional layer and the third organic functional layer.

In this structure, when the organic EL display panel emits light corresponding to the three colors R, G, and B, it is preferable that the first color be blue, since blue has the shortest wavelength.

The first organic functional layer, second organic functional layer, and third organic functional layer may be either a charge injection layer or a charge transport layer, or may be an organic light emitting layer.

The electrode plates (first electrode plates, second electrode plates, and third electrode plates) may be anodes, and the counter electrode may be a cathode. Alternatively, the electrode plates may be cathodes, and the counter electrodes may be anodes.

A display device may be structured using the organic EL display panel according to the above aspect.

An organic EL display panel according to another aspect of the present invention comprises: a first electrode plate group including a plurality of first electrode plates that correspond to a first color and are arranged in a line; a second electrode plate group including a plurality of second electrode plates that correspond to a second color and are arranged in a line adjacent to the first electrode plate group; a first bank along an edge of the first electrode plate group opposite the second electrode plate group; a second bank between the first electrode plate group and the second electrode plate group along respective edges thereof; a third bank along an edge of the second electrode plate group opposite the first electrode plate group; a first organic functional layer between the first bank and the second bank and above the first electrode plate group; a second organic functional layer between the second bank and the third bank and above the second electrode plate group; and a counter electrode disposed to cover both the first organic functional layer and the second organic functional layer, wherein each of the first electrode plates includes a concavity, the volume of the first organic functional layer on any of the first electrode plates is equal to, or an approximation of, the volume of the second organic functional layer on any of the second electrode plates, and a portion of the first organic functional layer has entered into the concavity in each of the first electrode plates, so that in locations other than the concavity, the first organic functional layer on the first electrode plates is thinner than the second organic functional layer on the second electrode plates. According to the above structure, by finely adjusting the volume of the concavity in the first electrode plate, it becomes easy to finely adjust the film thickness of the first organic functional layer in locations of the first electrode plate other than the concavity. Therefore, it is easy to finely adjust the film thickness of the organic layer to match the wavelength of each luminescent color, which contributes to manufacturing a light-emitting display panel with excellent light-emitting characteristics.

A method of manufacturing an organic EL display panel according to another aspect of the present invention comprises the steps of: a first step of forming a first electrode plate group including a plurality of first electrode plates that correspond to a first color and are arranged in a line; a second step of forming a second electrode plate group including a plurality of second electrode plates that correspond to a second color and are arranged in a line adjacent to the first electrode plate group; a third step of forming a first bank along an edge of the first electrode plate group opposite the second electrode plate group; a fourth step of forming a second bank between the first electrode plate group and the second electrode plate group along respective edges thereof; a fifth step of forming a third bank along an edge of the second electrode plate group opposite the first electrode plate group; a sixth step of forming a first organic functional layer between the first bank and the second bank and above the first electrode plate group; a seventh step of forming a second organic functional layer between the second bank and the third bank and above the second electrode plate group; and an eighth step of forming a counter electrode disposed to cover both the first organic functional layer and the second organic functional layer, wherein the first step includes forming a concavity on each of the first electrode plates; the volume the first organic functional layer formed in the sixth step is equal to, or an approximation of, the volume of the second organic functional layer formed in the seventh step, and a portion of the first organic functional layer enters into the concavity in each of the first electrode plates, so that in locations other than the concavity, the first organic functional layer on the first electrode plates is formed thinner than the second organic functional layer on the second electrode plates. According to the above structure, by finely adjusting the volume of the concavity in the first electrode plate, it becomes easy to finely adjust the film thickness of the first organic functional layer in locations of the first electrode plate other than the concavity. Therefore, it is easy to finely adjust the film thickness of the organic layer to match the wavelength of each luminescent color, which contributes to manufacturing a light-emitting display panel with excellent light-emitting characteristics.

In the above structure, a TFT layer may be provided below the first electrode plate group and the second electrode plate group, an interlayer insulation film may be layered between (i) the first electrode plate group and the second electrode plate group and (ii) the TFT layer, and a plurality of contact holes may penetrate through the interlayer insulation film and have wiring lines connecting the first electrode plates and the second electrode plates with the TFT layer. Furthermore, the one or more concavities included in each of the first electrode plates and each of the second electrode plates may coincide with the contact holes.

Embodiment 1

(Structure of Display Panel 100)

The display panel unit 100 is an organic EL panel that uses the phenomenon of electroluminescence occurring in organic material.

Figure 2:
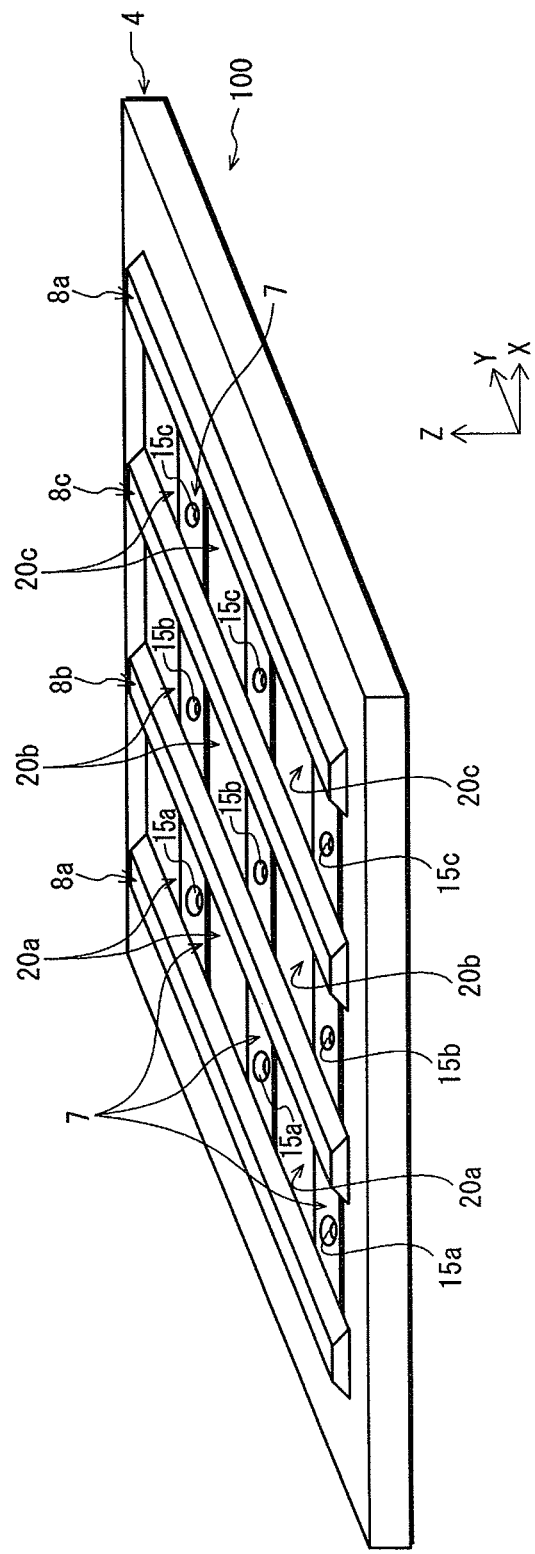
FIG. 2 is a perspective view showing the structure of the display panel 100.

FIG. 1 is a cross-section diagram schematically showing the structure of the display panel 100 according to Embodiment 1. FIG. 2 is a perspective view showing the structure of the display panel 100.

Pixels are arranged in a matrix in the vertical and horizontal (X-Y) directions in the display panel 100. Each pixel is formed by three adjacent sub-pixels whose colors are respectively R, G, and B. The organic EL elements 20a, 20b, and 20c shown in FIG. 2 are top-emission type EL elements disposed on a TFT substrate 4. The organic EL elements 20a are sub-pixels of a first color (blue), the organic EL elements 20b are sub-pixels of a second color (green), and organic EL elements 20c are sub-pixels of a third color (red).

As shown in FIG. 2, the blue organic EL elements 20a, green organic EL elements 20b, and red organic EL elements 20c are arranged in longitudinal lines (in the direction of the Y axis) in this order. Three organic EL elements 20a, 20b, and 20c that are contiguous horizontally (in the direction of the X axis) form one pixel.

FIG. 1 shows a longitudinal cross-section of the organic EL elements 20a (in the direction of the Y axis). As shown in FIG. 1, the TFT substrate 4 includes a substrate 1 with a TFT, wiring lines, and interlayer insulation film 3 formed thereon in this order. On the TFT substrate 4, anode plates 5, hole-injection layers 6, and pixel defining layers 7 are laminated in this order. Furthermore, banks 8 (not shown in FIG. 1; 8a-8c in FIG. 2), organic layers 9, light-emitting layers 10, and a cathode layer 11 are formed, thus forming the organic EL elements 20a, 20b, and 20c. Note that in FIG. 2, the organic layers 9, light-emitting layers 10, and cathode layer 11 are not shown.

The substrate 1 forms the base of the display panel 100 and is formed with an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

On the surface of the substrate 1, a TFT layer is formed to drive each of the organic EL elements 20a-20c in the entire panel by an active matrix method. The TFT layer includes a TFT, wiring lines, SD electrodes, etc. Note that in FIG. 1, reference sign 2 indicates the SD electrodes of the TFT.

The interlayer insulation film 3 is formed from an organic material with excellent insulating properties such as polyimide, polyamide, or acrylic resin and covers the entire TFT layer of the substrate 1.

A contact hole 13 is bored in the direction of thickness (direction of Z axis) of the interlayer insulation film 3 at each organic EL element 20a, 20b, and 20c.

Each contact hole 13 has a circular bottom. The contact holes 13 shown in FIG. 1 are circular truncated cones, wherein the inner surface is in a forward tapered shape so that the top (opening) of each contact hole 13 has a larger diameter than the bottom. Alternatively, the contact holes 13 may be formed in a circular cylindrical shape, wherein the top diameter and the bottom diameter are equivalent. The shape of the bottom of the contact holes 13 may also of course be a shape other than a circle, such as an ellipse, a rectangle, etc.

The volume of the contact holes 13 formed in blue sub-pixels is larger than the volume of the contact holes 13 formed in green and red sub-pixels.

Next, the structure of the display panel 100 is described in detail with reference to FIGS. 3A-3C. FIG. 3A is a plan view showing the structure of the display panel 100, FIG. 3B is a cross-section diagram from A to A in FIG. 3A, and FIG. 3C is a cross-section diagram from B to B in FIG. 3A. Note that in FIGS. 3A-3C as well, the light-emitting layers 10 and cathode layer 11 are not shown.

FIGS. 3A-3C show the following structure. Anode plates 5a for blue sub-pixels and hole-injection layers 6a are arranged in a longitudinal line (in the direction of the Y axis) together to form a first anode plate group. Next to the first anode plate group, anode plates 5b for green sub-pixels and hole-injection layers 6b are arranged in a longitudinal line (in the direction of the Y axis) to form a second anode plate group. Next to the second anode plate group, anode plates 5c for red sub-pixels and hole-injection layers 6c are arranged in a longitudinal line (in the direction of the Y axis).

A first bank (bank 8a) is formed longitudinally (in the direction of the Y axis) bordering the first anode plate group on the opposite side from the second anode plate group. A second bank (bank 8b) is formed longitudinally (in the direction of the Y axis) between the first anode plate group and the second anode plate group. A third bank (bank 8c) is formed longitudinally (in the direction of the Y axis) between the second anode plate group and the third anode pate group. A fourth bank (bank 8a) is formed longitudinally (in the direction of the Y axis) bordering the third anode plate group on the opposite side from the second anode plate group.

Between the bank 8a and the bank 8b, an organic layer 9a is formed above the first anode plate group. Between the bank 8b and the bank 8c, an organic layer 9b is formed above the second anode plate group. Between the bank 8c and the bank 8a, an organic layer 9c is formed above the third anode plate group.

Above the organic layer 9a, a light-emitting layer 10 that emits blue light is formed. Above the organic layer 9b, a light-emitting layer 10 that emits green light is formed. Above the organic layer 9c, a light-emitting layer 10 that emits red light is formed.

The anode plates 5 are formed on the interlayer insulation film 3 as a rectangle in a region corresponding to each sub-pixel. The size of the anode plates 5 is equivalent in each sub-pixel.

The anode plates 5 are preferably formed using a light-reflective material. Other than Ag (silver), examples include Al or an Al alloy, a silver-palladium-copper alloy, a silver-rubidium-gold alloy, MoCr (alloy of molybdenum and chromium), NiCr (alloy of nickel and chromium), etc.

The hole-injection layers 6 are formed from an oxide of molybdenum or tungsten and are formed on the anode plates 5 in the same shape as the anode plates 5.

Note that, as shown in FIGS. 3B and 3C, the anode plates 5 and hole-injection layers 6 are concave in conformity with the inner surface of the contact holes 13. The anode plates 5 are connected electrically inside the contact holes 13 to the SD electrodes 2 of the TFT.

The pixel defining layer 7 is an insulating, inorganic film of silicon dioxide ($SiO_2$), silicon nitride (SiN), silicon oxynitride (SiON), etc. The thickness is 10 nm-200 nm.

The pixel defining layers 7 are disposed in the shape of lines extending horizontally (in the direction of the X axis) at equal pitch and width longitudinally (in the direction of the Y axis). The pixel defining layers 7 cover the gap between anode plates 5 and hole-injection layers 6 of organic EL elements that are adjacent longitudinally (in the direction of the Y axis), as well as the inner surface of the contact holes 13.

The hole-injection layers 6 and pixel defining layers 7 are also formed along the anode plates 5. Therefore, a concavity 15 is formed on the upper surface of the hole-injection layers 6 and pixel defining layers 7, along the inner surface of the contact holes 13. As described above, the volume of the contact holes 13 is larger in blue sub-pixels. The volume of the concavity 15a formed in blue sub-pixels is consequently larger than the volume of the concavities 15b and 15c formed in green and red sub-pixels.

Note that in FIG. 3B, both the top and the bottom of the concavity 15a are larger than the respective tops and bottoms of the concavities 15b and 15c. However, the volume of the concavity 15a may be made larger than the volume of the concavities 15b and 15c by making the size (diameter) of the bottoms equivalent (i.e. a difference in diameter of within 5%) and the size (diameter) of the top larger in the concavity 15a than in the concavities 15b and 15c.

The banks 8 (8a-8c) are formed from an organic material with insulating properties (such as acrylic resin, polyimide resin, novolac-type phenolic resin, etc.) and at least the surface thereof is provided with repellency. The banks 8a, 8b, and 8c are formed in a pattern of long longitudinal lines (in the direction of the Y axis) with equivalent horizontal pitch (in the direction of the X axis), so as to exist between contiguous organic EL elements 20a, 20b, and 20c. The cross-sectional shape of each bank 8a, 8b, and 8c is a trapezoid, and the width of each bank is uniform.

The organic layers 9 are formed in the areas between contiguous banks 8, so as to cover the hole-injection layers 6 and pixel defining layers 7. The light-emitting layers 10 are also formed in the areas between contiguous banks 8, on the organic layers 9.

Each of the hole-injection layers 6, pixel defining layers 7, organic layers 9, and light-emitting layers 10 partially fill the concavities 15.

The organic layers 9 are hole transporting layers formed from material having hole-injection effects with respect to the light-emitting layers 10. Specific examples of such material include triarylamine-based compounds such as 4-4'-Bis [N-(naphthyl)-N-phenyl-amino] biphenyl (α-NPB or α-NPD), N,N'-Bis (3-methylphenyl)-(1,1'-biphenyl)-4,4'-diamine (TPD), etc.

Note that the anode plates 5, hole-injection layers 6, and organic layers 9 are formed from the same material for the three colors of organic EL elements 20a, 20b, and 20c, whereas the light-emitting layers 10 are formed from different light-emitting materials, i.e. blue, green, and red, respectively for the organic EL elements 20a, 20b, and 20c.

Examples of the material in the light-emitting layers 10 include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The cathode layer 11 is formed to cover all of the light-emitting layers 10 of the three colors of organic EL elements 20a, 20b, and 20c. The cathode layer 11 is formed from a transparent material, such as ITO, indium zinc oxide (IZO), etc.

Note that, while not shown in the figures, a passivation layer is provided above the cathode layer 11. The passivation layer is formed from a transparent material such as silicon nitride (SiN), silicon oxynitride (SiON), etc.

In the display panel 100, the pitch and width of the banks 8 are uniform, as are the pitch and width of the pixel defining layers 7. Therefore, the size of the sub-pixels surrounded by the banks 8 and the pixel defining layers 7 is also uniform.
(Example of Structure of Display Device)

Figure 10:
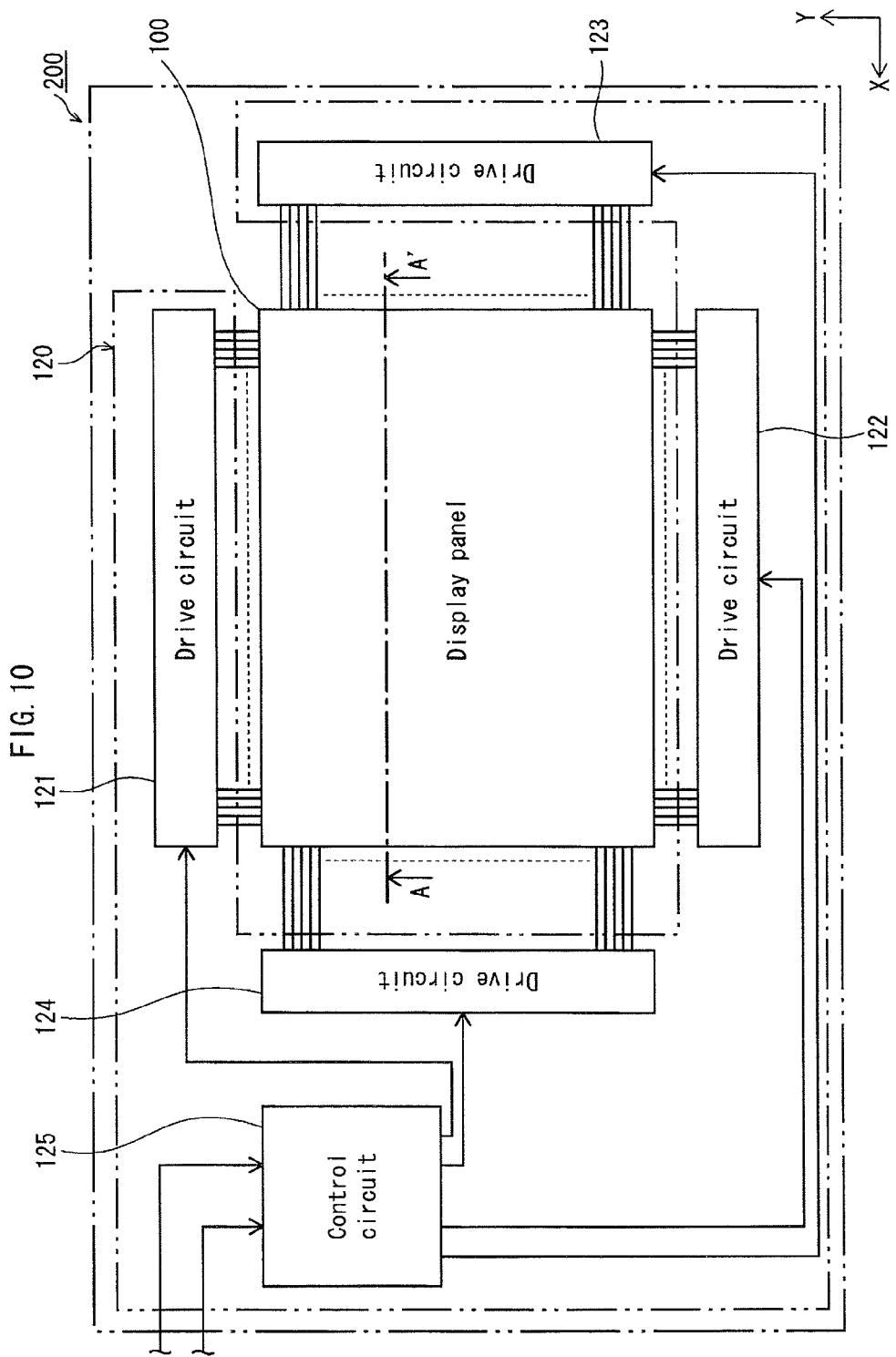
FIG. 10 is a diagram showing the overall structure of a display device 200 according to the Embodiments.

FIG. 10 shows the structure of a display device 200 provided with the display panel 100.

Figure 11:
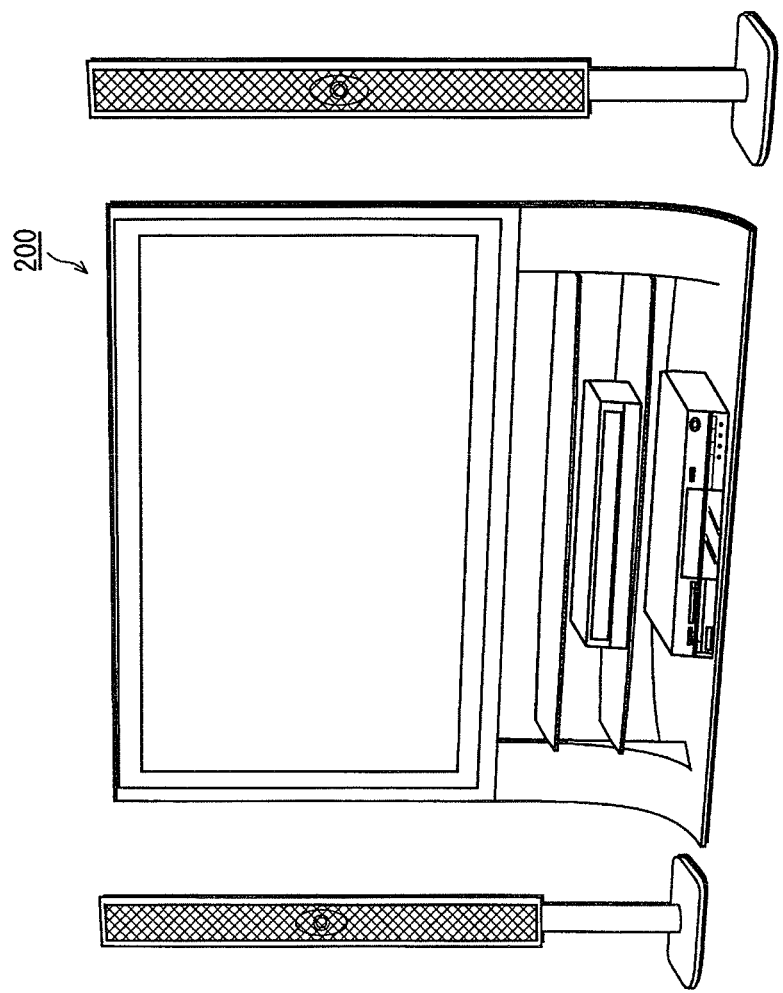
FIG. 11 is an appearance profile of an example of a television system that includes the display device 200.

The display device 200 includes a display panel 100 and a drive control unit 120 connected thereto. The drive control unit 120 is composed of four drive circuits 121-124 and a control circuit 125. FIG. 11 is an appearance profile of an example of a television system that includes the display device 200.
(Method of Manufacturing Display Panel 100)

First, an example of an overall method of manufacturing the display panel 100 is described with reference to FIG. 4.

The following describes the process of manufacturing the TFT substrate 4.

The substrate 1 is prepared and placed in the chamber of a sputtering apparatus for film formation.
Formation of TFT Layer A predetermined sputter gas is introduced into the chamber, and via reactive sputtering, the TFT layer that includes the TFT, wiring lines, and SD electrodes 2 is formed (FIG. 4A).
Formation of Interlayer Insulation Film The interlayer insulation film 3 is formed on the substrate 1 to a thickness of approximately 4 μm so as to cover the TFT layer (FIG. 4B). At this point, a contact hole 13 is formed in the interlayer insulation film 3 above the SD electrode 2. Such an interlayer insulation film 3 having the contact hole 13 may be formed by spin coating a known photosensitive organic material (such as a photosensitive polyimide based on a siloxane copolymer) and then performing photolithography to form a pattern using a pattern mask.

The opening of the contact hole 13 is formed in accordance with the shape of the opening in the pattern mask. Therefore, adjusting the shape of the opening in the pattern mask consequently adjusts the shape of the opening of the contact hole 13. The inclination of the inner circumference of the contact hole 13 can also be adjusted by using a half-tone mask as a pattern mask.

Alternatively, after forming a uniform interlayer insulation film, the location where the contact hole is to be formed can be removed by etching, thus forming the contact hole 13.

In this case, a photoresist is overlaid on the interlayer insulation film, and thereabove, a pattern mask matching the contact hole to be formed is overlaid. Next, a resist pattern is formed by shining light of a predetermined wavelength, to which the material in the photoresist is sensitive, on the photoresist from above the pattern mask and then applying a developing solution. Subsequently, excess interlayer insulation film material and non-hardened photoresist is washed off with an aqueous or non-aqueous etchant (release agent) to form the contact hole 13 on the interlayer insulation film. The residual photoresist is removed by washing with pure water, which completes the patterning.

The following describes the process of forming the organic EL elements of each color on the TFT substrate 4 manufactured as described above.
Formation of Anode Plate On the interlayer insulation film 3, metal material for the anode plate 5 is sputtered to form a thin film of a predetermined thickness, for example 50 nm-400 nm. This thin film is then patterned via wet etching to form the anode plate 5. The anode plate 5 at this point is also formed on the inner surface of the contact hole 13. Therefore, the anode plate 5 is concave in conformity with the inner surface of the contact hole 13, and is also electrically connected to the SD electrode 2 by direct contact therewith (FIG. 4C). During this process, the concavities 15a-15c are respectively formed on the anode plates 5a-5c.
Formation of Hole-Injection Layer Next, on the anode plate 5, a thin film is formed by reactive sputtering using metal material such as molybdenum or tungsten. By performing photolithography and wet etching on this thin film, the hole-injection layer 6 is formed (FIG. 4D).
Forming Pixel Defining Layer Next, using the CVD method, a thin film of SiO2, SiN, or SiON is formed and patterned via dry etching to form the pixel defining layer 7 (FIG. 4E).

Each hole-injection layer 6 and pixel defining layer 7 also have a partially concave shape, along the concavities 15a-15c in the anode plates 5.
Formation of Banks Next, resist material is sprayed on the interlayer insulation film 3 as bank material and patterned via photolithography to form the banks 8a, 8b, and 8c (FIG. 4F). The resist material is, for example, a photoresist, or resist material that includes fluorine-based or acrylic material.

Note that, during this process of forming the banks, the surface of the bank 8 may be treated with an alkaline solution, water, or an organic solvent, or by plasma treatment, in order to provide the surface of the bank 8 with repellency or to adjust the contact angle of the bank 8 with respect to the next ink to be sprayed.
Formation of Organic Layer (Hole Transporting Layer)

Next, the organic layer 9 is formed by the wet method (FIG. 4G).

To do so, the organic material for the organic layer is mixed with solvent at a predetermined ratio to manufacture organic layer ink. This ink is then sprayed between adjacent banks 8. Specifically, ink is sprayed using a known inkjet method between bank 8a (the first bank) and bank 8b (the second bank), between bank 8b and bank 8c (the third bank), and between bank 8c and bank 8a (the fourth bank).

FIG. 5 is a schematic cross-section diagram showing conditions immediately after spraying ink for forming the organic layer on the substrate via the wet method.

In FIG. 5, each arrow indicates the position at which an ink drop is ejected from a nozzle towards the substrate 1. Above the anode plate 5 and hole-injection layer 6 in each sub-pixel, the same number of drops of ink are dripped on the same location. In the example in FIG. 5, ink is dripped at seven locations into each region for forming each sub-pixel.

The sprayed ink covers the entire surface of the hole-injection layer 6, also entering the concavity 15 in the contact hole 13.

Since the amount of each drop of ink ejected from the nozzle is constant, ink is sprayed in the same way into regions for forming a plurality of sub-pixels. The amount of ink sprayed on each anode plate 5 is also equivalent, with variation equal to or less than 5%.

Note that alternative methods for filling the regions between banks with ink that forms the organic layer 9 include the dispenser method, nozzle coating method, spin coating, intaglio printing, letterpress printing, etc. In all of these methods, the amount of ink sprayed on each anode plate 5 and hole-injection layer 6 is equivalent for sub-pixels of each color.

By drying the ink layer thus formed, the organic layer 9 forms.

Formation of Light-Emitting Layer

On the organic layer 9, the light-emitting layer 10 is formed by the wet method. This process is the same as the above process of forming the organic layer. Material for forming the light-emitting layer is dissolved to yield ink. The ink is sprayed between adjacent banks 8 and dried to form the organic layer. The light-emitting layer material that is used differs by luminescent color.

Note that alternative methods for filling the regions between banks with ink that forms the light-emitting layer 10 include the dispenser method, nozzle coating method, spin coating, intaglio printing, letterpress printing, etc.

Next, on the surface of the light-emitting layer 10, a layer of ITO, IZO, etc. is formed by the vacuum deposition method. The cathode layer 11 is thus formed. Furthermore, on the surface of the cathode layer 11, a layer of silicon nitride (SiN), silicon oxynitride (SiON), etc. material is formed by the vacuum deposition method to form the passivation layer.

All of the organic EL elements 20a-20c are formed by the above processes, thus completing the display panel 100.

(Volume of Concavities 15 and Film Thickness of Organic Layer 9)

In the display panel 100, the volume of the concavity 15a formed in the anode plate 5a for the color blue (first color) is larger than the volume of the concavity 15b and larger than the volume of the concavity 15c respectively formed in the anode plates 5b and 5c corresponding to the colors green and red (second color and third color). Part of each organic layer 9 enters into the concavities 15a, 15b, and 15c. Due to the difference in volume between the concavity 15a and the concavities 15b and 15c, the organic layer 9 in the blue sub-pixel is formed to a thinner film thickness than the organic layer 9 in the green sub-pixel and the organic layer 9 in the red sub-pixel (i.e. the film thickness in a region other than the concavity).

Accordingly, in the display panel 100, it is easy to set the film thickness of the organic layer 9 to be appropriate for the wavelength of the luminescent color in each sub-pixel.

The following is a detailed consideration of the relationship between the volume of the concavity 15 formed in the anode plate 5 and the film thickness of the organic layer 9.

In one sub-pixel, let the area of the region on the anode plate 5 that is filled by ink (regions shown by reference signs 5a, 5b, and 5c in FIG. 3A) be S, the quantity of ink on the anode plate 5 in one sub-pixel (hatched region C in FIG. 5) be V0, the solute concentration of the ink for the organic layer be N, and the volume of the concavity 15 formed in the anode plate 5 be V1 (further letting the volume of the concavity 15a formed in the blue sub-pixel be V1a, and the volume of the concavities 15b and 15c respectively formed in the green and red sub-pixels be V1b and V1c).

Supposing there is no concavity in the anode plate 5, the height of the ink layer formed on the anode plate 5 is estimated as V0/S, and the film thickness of the organic layer 9 formed after drying is estimated as NV0/S. However, the concavity 15 (volume V1) is formed on the anode plate 5, and thus part of the ink fills the concavity 15 (ink is assumed to fill the entire concavity 15, as shown by the hatched region D in FIG. 5). Therefore, the fill volume V1 (i.e. volume of ink filling the concavity 15) is subtracted from the volume of ink that fills regions other than the concavity 15 in the anode plate 5 (V0−V1).

Accordingly, the height of the ink layer (H in FIG. 5) equals V0/S multiplied by (V0−V1)N1, and the film thickness after drying of the ink (h in FIG. 5) equals NV0/S multiplied by (V0−V1)/V0. The film thickness h of the organic layer 9 is therefore N(V0−V1)/S.

The fill volume V1a in the blue sub-pixel is larger than the fill volume V1b in the green and red sub-pixels. Therefore, the organic layer 9 formed in regions other than the concavity 15a on the anode plate 5 in the blue sub-pixel is thinner than the organic layer 9 formed in regions other than the concavities 15b and 15c on the anode plate 5 in the green and red sub-pixels by a ratio of N(V1a−V1b)/S.

In this context, the size of each concavity 15a, 15b, and 15c is defined by the size of the contact hole formed on the interlayer insulation film 3, and it is possible to finely adjust the size as described below. Therefore, it is possible to adjust the volume V1a and V1b of the concavities in finer increments than it is possible to adjust the volume of one drop of ink, thus enabling fine adjustments to the film thickness of each organic layer 9.

As a comparative example, the film thickness can be adjusted by changing the number of drops of ink that are dripped into the sub-pixel of each color. A finer difference between V1a and V1b can be established with Embodiment 1 than with such a comparative example, however, thus allowing for a finer difference between the thickness of blue ink and of green ink.

The following is a consideration of a specific, numerical example.

For example, in one sub-pixel, let the size of the region filled with ink on the anode plate 5 (regions shown by reference signs 5a, 5b, and 5c in FIG. 3A) be 300 μm long and 70 μm wide, and the area of the region filled with ink on the anode plate 5 be $S=2.1 \times 10^{-8}$ m$^2$.

Furthermore, let the solute concentration N of the ink for the organic layer be 2 vol % and the drop amount of one drop of ink ejected by the inkjet be 30 pL, and let seven drops of ink be ejected on the anode plate 5 in each sub-pixel, so that V0, the quantity of ink on the anode plate 5 in one sub-pixel, equals 210 pL ($2.1 \times 10^{-13}$ m$^3$).

If there is no concavity in the anode plate 5, then the height H of the ink layer formed on the anode plate 5 is V0/S=10 μm, and the film thickness h of the organic layer 9 formed after drying is NV0/S=0.2 μm. In this example, however, disc-shaped concavities 15a-15c are respectively formed on the anode plates 5 in the sub-pixel of each color. Let the height of the concavities 15a-15c be uniform at 4 μm and the diameter be 30 μm in the concavities 15b and 15c in the green and red sub-pixels. Let the diameter in the blue sub-pixels be an additional 5 μm for a total of 35 μm. In this case, the concavity volume V1b in the green and red sub-pixels equals 2.826 pL, and the concavity volume V1a in the blue sub-pixels equals 3.847 pL.

Accordingly, the film thickness h of the organic layer 9 in the green and red sub-pixels is N(V0−V1b)/S=0.1973 μm, whereas the film thickness h of the organic layer 9 in the blue sub-pixels is N(V0−V1a)/S=0.1963 μm. The difference in film thickness is N(V1a−V1b)/S=0.0010 μm (1 nm).

The organic layer 9 in the blue sub-pixels can thus be adjusted to be thinner than the organic layer 9 in the green and red sub-pixels by a minute difference.

On the other hand, when the number of drops of ink that are dripped into each sub-pixel in a comparative example is increased or decreased by one drop, the film thickness of the organic layer that forms increases or decreases by 0.0285 μm. Therefore, adjustments to the film thickness can only be made in 0.0285 μm increments.

As described above, in the display panel 100 manufactured according to Embodiment 1, the volumes of the concavities 15a, 15b, and 15c formed in the sub-pixels of each color are adjusted more finely than the volume of ink drops, making it relatively easy to finely adjust the film thickness of the organic layer 9. Therefore, it is easy to adjust the film thickness of the organic layer 9 to be appropriate for the wavelength of the luminescent color in each sub-pixel, thereby efficiently producing light.

Embodiment 2

Figure 6:
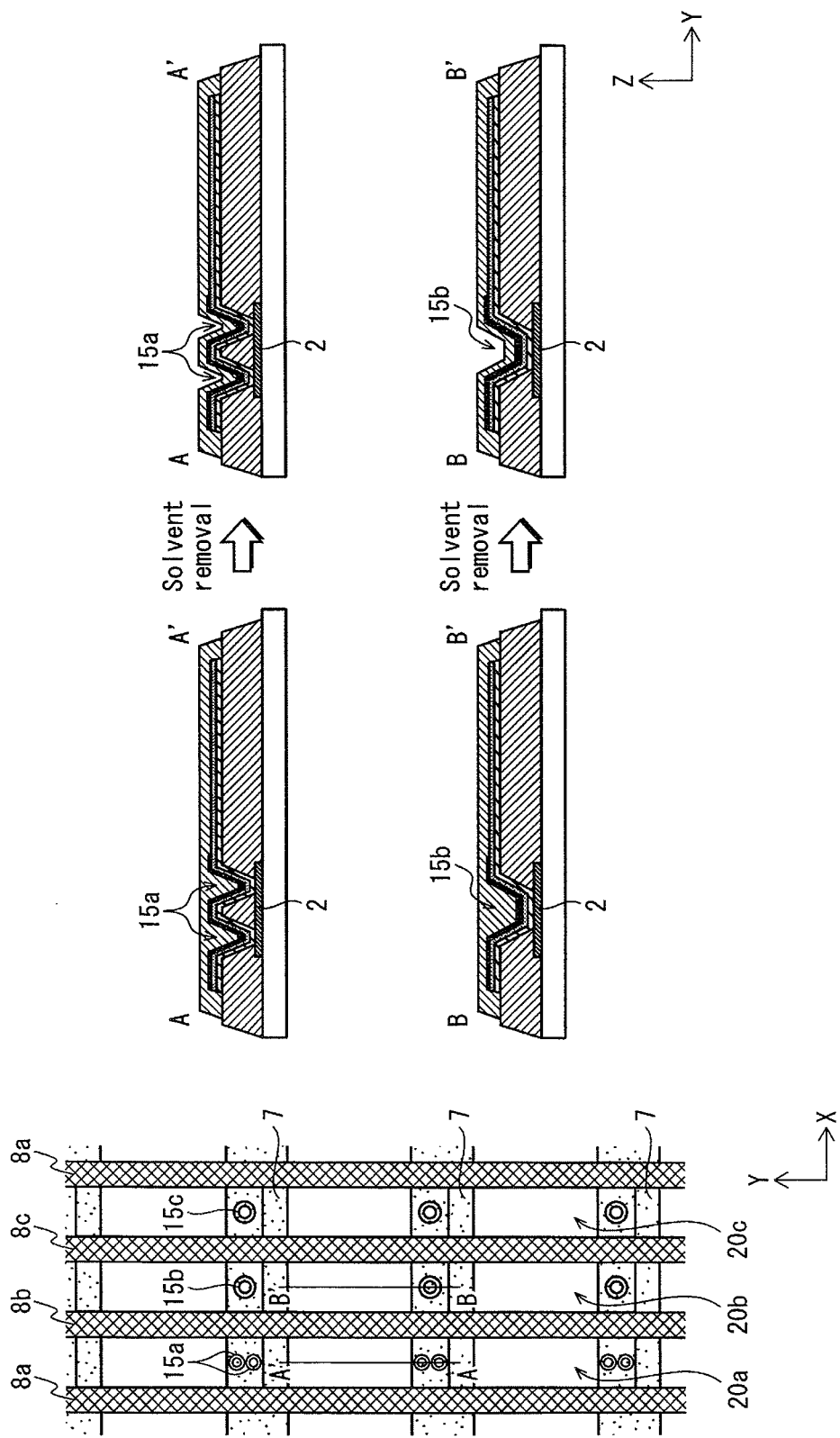
FIG. 6 is a plan view and a cross-section diagram schematically showing the structure of a display panel 100 according to Embodiment 2.

FIG. 6 is a plan view and a cross-section diagram schematically showing the structure of a display panel 100 according to Embodiment 2.

In Embodiment 1, the volume V1a of the concavity 15a in the blue sub-pixel is larger than the volume V1b of the concavities 15b and 15c in the green and red sub-pixels. In Embodiment 2, however, two contact holes 13 are formed on the SD electrode 2 in the blue organic EL element 20a. Two concavities 15a are thus formed in the blue sub-pixel. The green and red sub-pixels still each only have one concavity, respectively concavities 15b and 15c.

The total volume of the two concavities 15a formed in the blue sub-pixel is larger than the volume of either the concavity 15b formed in the green sub-pixel and the concavity 15c formed in the red sub-pixel.

For the same reasons as explained with regard to Embodiment 1, in the display panel 100 in Embodiment 2 the film thickness of the organic layer 9 can be finely adjusted.

It is preferable for (i) the total surface area of the bottom of the two concavities 15a in the blue sub-pixel, (ii) the surface area of the bottom of the concavity 15b in the green sub-pixel, and (iii) the surface area of the bottom of the concavity 15c in the red sub-pixel to be equivalent, i.e. for the area of the bottom surface in contact with the SD electrode 2 in each concavity to be equivalent. Such equivalency ensures that the contact resistance between the contact hole and the SD electrode in the sub-pixel of each color is constant.

Forming the concavities 15a, 15b, and 15c in a forward tapered shape so that the diameter at the top is larger than at the bottom allows for equivalent surface areas while making the total volume of the two concavities 15a larger than the volume of the concavity 15b and the concavity 15c.

This matter is explained below through a specific example.

Figure 7A:
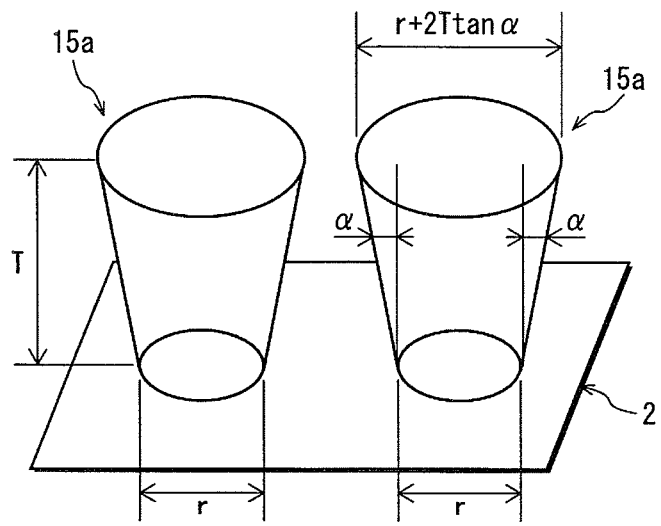
FIGS. 7A and 7B are schematic diagrams respectively showing the shapes of concavities 15a and of concavities 15b and 15c according to Embodiment 2.
Figure 7B:
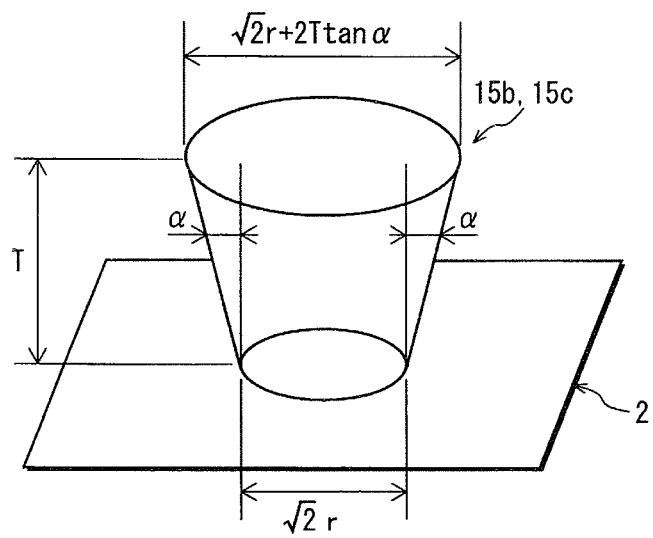

FIG. 7A shows the shape of the concavities 15a formed on the blue sub-pixel, and FIG. 7B shows the shape of the concavities 15b and 15c respectively formed on the green and red sub-pixels.

In this example, the concavities 15a and the concavities 15b and 15c are circular truncated cones that are in a forward tapered shape so that the top of the cone has a larger diameter than the bottom. The bottom surface of each concavity is in contact with the upper surface of the SD electrode 2. The height of the concavities 15a and of the concavities 15b and 15c is the same as the thickness T of the interlayer insulation film. The taper angle α formed between the inner surface of the concavities 15a, 15b, and 15c and the SD electrode 2 is constant.

Letting the diameter of the bottom surface of the concavity 15a be r, and the total bottom surface area of the two concavities 15a be equal to the bottom surface area of the concavity 15b (or 15c), the diameter of the concavity 15b (or 15c) is √2r.

Formula 1 expresses the volume of one of the concavities 15a.

$$\left[\frac{1}{4}r^2 + \frac{1}{2}rT\tan\alpha + \frac{1}{3}T^2\tan^2\alpha\right]\pi T \qquad \text{Formula 1}$$

Formula 2 expresses the volume of the concavity 15b.

$$\left[\frac{1}{2}r^2 + \frac{\sqrt{2}}{2}rT\tan\alpha + \frac{1}{3}T^2\tan^2\alpha\right]\pi T \qquad \text{Formula 2}$$

Formula 3 expresses the sum of the volumes of two concavities 15a minus the volume of the concavity 15b.

$$\left[\frac{2-\sqrt{2}}{2}rT\tan\alpha + \frac{1}{3}T^2\tan^2\alpha\right]\pi T \qquad \text{Formula 3}$$

If the taper angle α is positive (indicating a forward taper), then the value expressed by Formula 3 is also positive, and the total volume of two concavities 15a is larger than the volume of the concavity 15b (or 15c).

Furthermore, as the taper angle α grows larger, so do the values expressed by Formulas 1, 2, and 3. Accordingly, the volume of the concavity 15a and of the concavity 15b grow larger, as does the difference between the volume of two concavities 15a and the concavity 15b.

It follows that adjusting the taper angle α allows for adjustment of this difference in volume, thus allowing for adjustment of the difference between the film thickness of the organic layer 9 in the blue sub-pixel and the film thickness of the organic layer 9 in the green and red sub-pixels.

Note that this taper angle α is normally between 20° and 30°. If the taper angle α is zero (i.e. when each concavity is a circular cylindrical shape), the value expressed by Formula 3 is zero, and the total volume of two concavities 15a is equivalent to the volume of the concavity 15b (or 15c).

In the above description, the number of contact holes formed on the blue sub-pixel is two, and the number of contact holes formed on each of the green and red sub-pixels is one. However, three contact holes may be formed on the blue sub-pixel, and either one or two contact holes formed on each of the green and red sub-pixels.

Embodiment 3

In Embodiments 1 and 2, the film thickness of the organic layer 9 is adjusted during manufacturing of the display panel 100 by filling the concavity 15 formed on the anode plate 5 along the contact hole 13 with part of the organic layer 9. In Embodiment 3, on the other hand, a concavity 15 is formed on the anode plate 5 in a location where no contact hole exists.

In this case as well, as described below, the organic layer 9 in the blue sub-pixel can be finely adjusted to be thinner than the organic layer 9 in the green and red sub-pixels, as in Embodiments 1 and 2.

Figure 8:
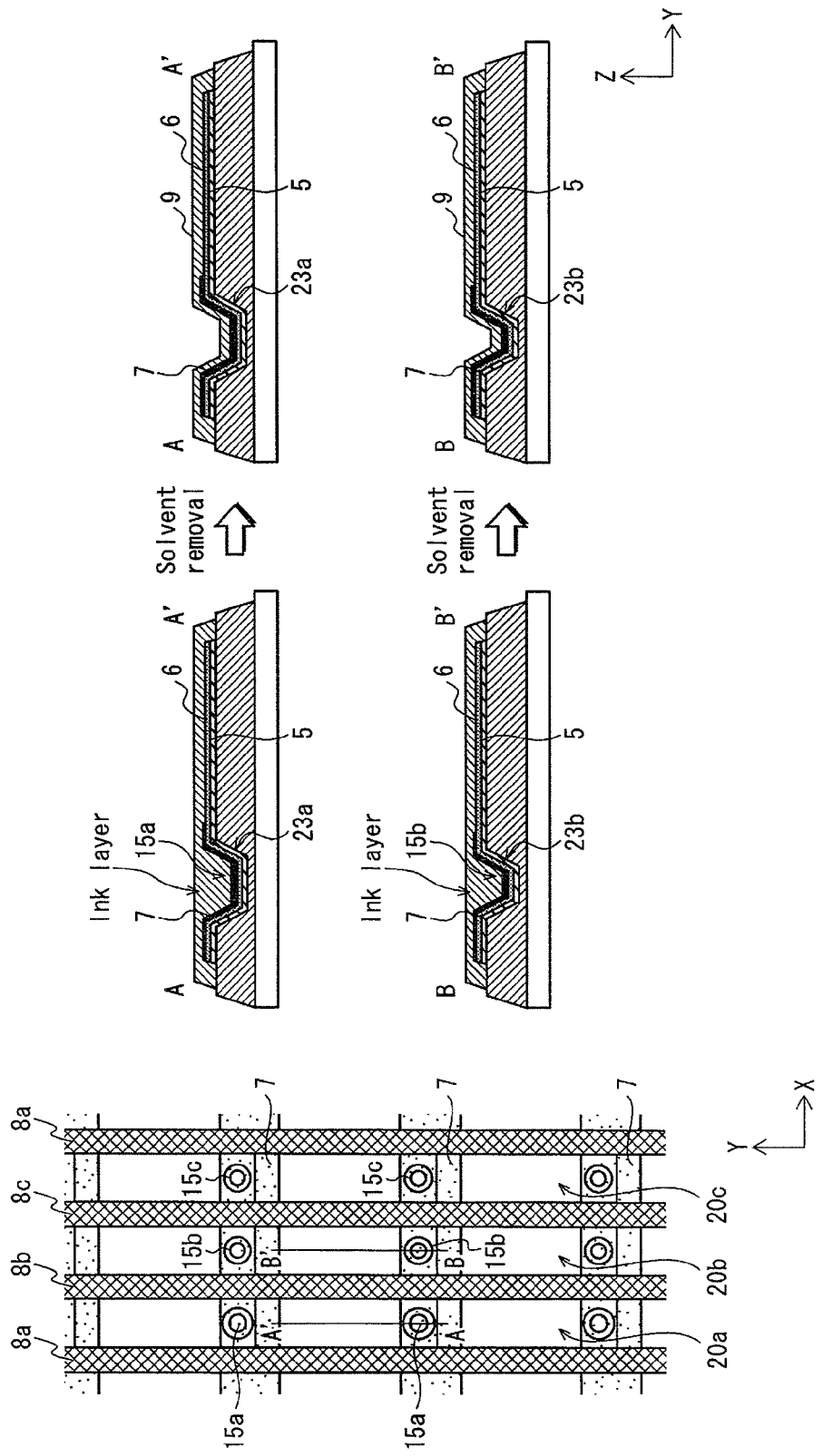
FIG. 8 is a plan view and a cross-section diagram schematically showing the structure of a display panel 100 according to Embodiment 3.

FIG. 8 is a cross-section diagram schematically showing a display panel 100 according to Embodiment 3 and a manufacturing process thereof.

On the upper surface of the interlayer insulation film 3, recesses 23 (23a, 23b) are formed in an area in which the anode plate 5 is formed. The volume of the recess 23a in the blue sub-pixel is larger than the volume of the recess 23b formed in the green sub-pixel and the red sub-pixel. The anode plate 5 is formed along the upper surface of the interlayer insulation film 3, with part of the anode plate 5 being concave in conformity with the inner surface of the recess 23.

A concavity 15 is formed on the inner surface of the recess 23 along the upper surface of the hole-injection layer 6 and pixel defining layer 7 formed along the anode plate 5. Part of the organic layer 9 enters into the concavity 15.

Note that the recesses 23a and 23b are not contact holes. Therefore, no SD electrode of the TFT exists at the bottom surface of the recesses 23a and 23b. The anode plate 5 is connected to the SD electrode of the TFT at a location not shown in the figures.

In Embodiment 3 as well, ink is sprayed so as to cover the hole-injection layer 6 and pixel defining layer 7 and dried to form the organic layer 9. The volume of the concavity 15a formed in the blue sub-pixel is larger than the volume of each of the concavities 15b and 15c formed in the green and red sub-pixels, and the difference in volume can be finely adjusted. Therefore, the organic layer 9 in the blue sub-pixel is thinner than the organic layer 9 in the green and red sub-pixels. Furthermore, thickness of the organic layer can be finely adjusted.

Accordingly, it is easy to adjust the film thickness of the organic layer 9 of each color, R, G, and B, to be an appropriate value for efficiently emitting light.

Embodiment 4

Figure 9:
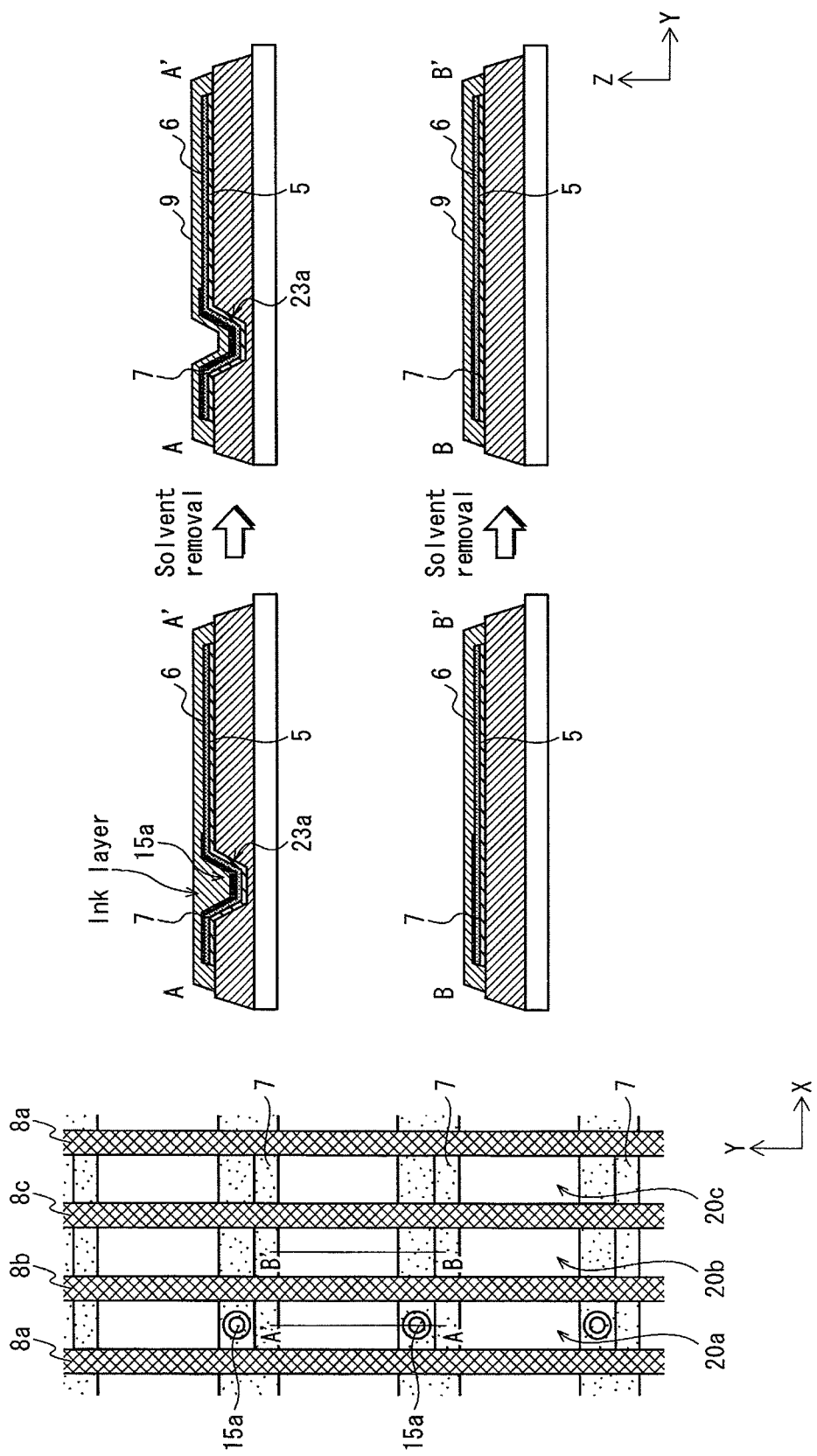
FIG. 9 is a cross-section diagram schematically showing a display panel 100 according to Embodiment 4 and a manufacturing process thereof.

FIG. 9 is a cross-section diagram schematically showing a display panel 100 according to Embodiment 4 and a manufacturing process thereof.

(Regarding Film Thickness of Organic Layer)

In Embodiments 1-3, concavities 15a, 15b, and 15c are formed on the anode plates 5 respectively in sub-pixels of each color, and part of the organic layer 9 fills the concavities. In Embodiment 4, however, concavities 15b and 15c are not formed on the anode plates 5b and 5c in the green and red sub-pixels. Rather, a concavity 15a is only formed on the anode plate 5a in the blue sub-pixel.

In this case, since there is no concavity in the green and red sub-pixels, the volume V1b is zero. With regards to the "film thickness of the organic layer" described in Embodiment 1, however, the concavity volume V1a in the blue sub-pixel can be finely adjusted as above to make the organic layer 9 in the blue sub-pixel thinner than the organic layer 9 in the green or red sub-pixels by a minute difference.

Accordingly, it is possible to adjust the film thickness of the organic layer 9 in the sub-pixels of each color to be an appropriate value for efficiently emitting light.

<Modifications, etc.>

In Embodiments 1-4, the organic layer 9 in the blue sub-pixels is thinner than the organic layer 9 in the green and red sub-pixels, and the film thickness of the organic layer 9 in the green and red sub-pixels is equivalent. However, the volume V1a of the concavity 15a formed on the anode plate 5a in the blue sub-pixel, the volume V1b of the concavity 15b formed on the anode plate 5b in the green sub-pixel, and the volume V1c of the concavity 15c formed on the anode plate 5c in the red sub-pixel may be set to decrease in this order, so that the film thickness of the organic layer 9 increases in the order of the blue sub-pixel, green sub-pixel, and red sub-pixel.

In Embodiments 1-4, one pixel is composed of three sub-pixels. If one pixel is composed of two sub-pixels, however, the organic layer 9 of the first color can be made thinner than the organic layer 9 of the second color by forming the concavity 15 on the anode plate 5 in the sub-pixel of the first color, or by forming the concavity 15 on the anode plate 5 in the sub-pixels of both the first and second colors and changing the volumes of the concavities 15. It is therefore possible to adjust the film thickness of the organic layer 9 in the sub-pixels of each color to be an appropriate value for efficiently emitting light.

Embodiments 1-4 describe an example in which the hole transporting layer is formed on the anode plate 5 as an organic layer by the wet method. However, when a hole-injection layer or a hole injection and transporting layer is formed as an organic layer by the wet method, the film thickness of the organic layer may similarly be finely adjusted to efficiently yield light of each luminescent color.

INDUSTRIAL APPLICABILITY

The method of manufacturing according to the present invention is appropriate for manufacturing an organic EL display panel as a display in cellular phones, televisions, etc., and is useful for creating a display with excellent luminous efficiency.

We claim:

1. An organic electroluminescence (EL) display panel, comprising:
   a first electrode plate group including a plurality of first electrode plates corresponding to a first color arranged in a first predetermined line;
   a second electrode plate group including a plurality of second electrode plates corresponding to a second color arranged in a second predetermined line adjacent to the first predetermined line arrangement of the first electrode plate group;
   a first bank along an edge of the first electrode plate group opposite the second electrode plate group;
   a second bank between the first electrode plate group and the second electrode plate group along respective edges thereof;
   a third bank along an edge of the second electrode plate group opposite the first electrode plate group;
   a first organic functional layer between the first bank and the second bank and above the first electrode plate group;
   a second organic functional layer between the second bank and the third bank and above the second electrode plate group;
   a counter electrode disposed to cover both the first organic functional layer and the second organic functional layer;
   a thin-film transistor (TFT) layer provided below the first electrode plate group and the second electrode plate group;
   an interlayer insulation film layered between (i) the first electrode plate group and the second electrode plate group and (ii) the TFT layer; and
   a plurality of contact holes that penetrate through the interlayer insulation film and have wiring lines connecting the first electrode plates and the second electrode plates with the TFT layer, wherein each of the first electrode plates and each of the second electrode plates includes at least one concavity, the at least one concavity included in each of the first electrode plates and each of the second electrode plates coincide with the plurality of contact holes, a total volume of the at least one concavity in any of the first electrode plates is larger than a total volume of the at least one concavity in any of the second electrode plates, a volume of a portion of the first organic functional layer corresponding to any of the first electrode plates at least approximates a volume of the second organic functional layer corresponding to any of the second electrode plates, and a portion of the first organic functional layer entered into the at least one concavity in any of the first electrode plates is larger than a portion of the second organic functional layer entered into the at least one concavity in any of the second electrode plates, so that in locations other than the at least one concavity in the first electrode plates and the second electrode plates, the first organic functional layer is thinner than the second organic functional layer.

2. The organic EL display panel of claim 1, wherein the TFT layer has source-drain (SD) electrodes, an area of any of the first electrode plates in contact through one of the contact holes with an SD electrode is equal to an area of any of the second electrode plates in contact through one of the contact holes with an SD electrode, and the volume of the portion of the first organic functional layer entered into the at least one concavity in any of the first electrode plates is larger than the volume of the portion of the second organic functional layer entered into the at least one concavity provided in each of the second electrode plates.

3. An organic electroluminescence (EL) display panel, comprising:

a first electrode plate group including a plurality of first electrode plates corresponding to a first color arranged in a first predetermined line;

a second electrode plate group including a plurality of second electrode plates corresponding to a second color arranged in a second predetermined line adjacent to the first electrode plate group;

a first bank along an edge of the first electrode plate group opposite the second electrode plate group;

a second bank between the first electrode plate group and the second electrode plate group along respective edges thereof;

a third bank along an edge of the second electrode plate group opposite the first electrode plate group;

a first organic functional layer between the first bank and the second bank and above the first electrode plate group;

a second organic functional layer between the second bank and the third bank and above the second electrode plate group; and a counter electrode disposed to cover both the first organic functional layer and the second organic functional layer, wherein each of the first electrode plates and each of the second electrode plates includes at least one concavity, each concavity in the first electrode plates and the second electrode plates is a circular truncated cone, a diameter at a top of the concavity being larger than a diameter at a bottom of the concavity, the diameter at the top of each of the at least one concavity in any of the first electrode plates is larger than the diameter at the top of each of the at least one concavity in any of the second electrode plates so that a total volume of the at least one concavity in any of the first electrode plates is larger than a total volume of the at least one concavity in any of the second electrode plates, a volume of a portion of the first organic functional layer corresponding to any of the first electrode plates at least approximates a volume of the second organic functional layer corresponding to any of the second electrode plates, and a portion of the first organic functional layer entered into the at least one concavity in any of the first electrode plates is larger than a portion of the second organic functional layer entered into the at least one concavity in any of the second electrode plates, so that in locations other than the at least one concavity in the first electrode plates and the second electrode plates, the first organic functional layer is thinner than the second organic functional layer.

4. The organic EL display panel of claim 3, wherein a diameter at a bottom of each of the at least one concavity in any of the first electrode plates is larger than a diameter at a bottom of each of the at least one concavity in any of the second electrode plates.

5. The organic EL display panel of claim 3, wherein a diameter at a bottom of each of the at least one concavity in any of the first electrode plates at least approximates a diameter at a bottom of each of the at least one concavity in any of the second electrode plates.

6. An organic electroluminescence (EL) display panel, comprising:

a first electrode plate group including a plurality of first electrode plates corresponding to a first color arranged in a first predetermined line;

a second electrode plate group including a plurality of second electrode plates corresponding to a second color arranged in a second predetermined line adjacent to the first electrode plate group;

a first bank along an edge of the first electrode plate group opposite the second electrode plate group;

a second bank between the first electrode plate group and the second electrode plate group along respective edges thereof;

a third bank along an edge of the second electrode plate group opposite the first electrode plate group;

a first organic functional layer between the first bank and the second bank and above the first electrode plate group;

a second organic functional layer between the second bank and the third bank and above the second electrode plate group; and a counter electrode disposed to cover both the first organic functional layer and the second organic functional layer, wherein each of the first electrode plates and each of the second electrode plates includes at least one concavity, a first pixel defining layer covers the at least one concavity in each of the first electrode plates, with the first organic functional layer being formed above the first pixel defining layer, a second pixel defining layer covers the at least one concavity in each of the second electrode plates, with the second organic functional layer being formed above the second pixel defining layer, a total volume of the at least one concavity in any of the first electrode plates is larger than a total volume of the at least one concavity in any of the second electrode plates, a volume of a portion of the first organic functional layer corresponding to any of the first electrode plates at least approximates a volume of the second organic functional layer corresponding to any of the second electrode plates, and a portion of the first organic functional layer entered into the at least one concavity in any of the first electrode plates is larger than a portion of the second organic functional layer entered into the at least one concavity in any of the second electrode plates, so that in locations other than the at least one concavity in the first electrode plates and the second electrode plates, the first organic functional layer is thinner than the second organic functional layer.

7. An organic electroluminescence (EL) display panel, comprising:
a first electrode plate group including a plurality of first electrode plates corresponding to a first color arranged in a first predetermined line;
a second electrode plate group including a plurality of second electrode plates corresponding to a second color arranged in a second predetermined line adjacent to the first electrode plate group;
a first bank along an edge of the first electrode plate group opposite the second electrode plate group;
a second bank between the first electrode plate group and the second electrode plate group along respective edges thereof;
a third bank along an edge of the second electrode plate group opposite the first electrode plate group;
a first organic functional layer between the first bank and the second bank and above the first electrode plate group;
a second organic functional layer between the second bank and the third bank and above the second electrode plate group; and
a counter electrode disposed to cover both the first organic functional layer and the second organic functional layer, wherein
each of the first electrode plates and each of the second electrode plates includes at least one concavity,
the first organic functional layer is continuous above the first electrode plate group due to ink drops of a predetermined volume being sprayed via an inkjet method,
the second organic functional layer is continuous above the second electrode plate group due to ink drops of the predetermined volume being sprayed via the inkjet method,
when ink drops of the predetermined volume are sprayed via the inkjet method, the first organic functional layer and the second organic functional layer are formed to a thickness between a thickness formed by spraying n of the ink drops and a thickness formed by spraying n+1 of the ink drops,
a total volume of the at least one concavity in any of the first electrode plates is larger than a total volume of the at least one concavity in any of the second electrode plates,
a volume of a portion of the first organic functional layer corresponding to any of the first electrode plates at least approximates a volume of the second organic functional layer corresponding to any of the second electrode plates, and
a portion of the first organic functional layer entered into the at least one concavity in any of the first electrode plates is larger than a portion of the second organic functional layer entered into the at least one concavity in any of the second electrode plates, so that in locations other than the at least one concavity in the first electrode plates and the second electrode plates, the first organic functional layer is thinner than the second organic functional layer.

8. The organic EL display panel of claim 1, wherein
a number of concavities included in each of the first electrode plates is larger than a number of concavities included in each of the second electrode plates, and
a volume of a portion of the first organic functional layer that has entered all of the concavities in the first electrode plates is larger than a volume of the second organic functional layer that has entered all of the concavities in any of the second electrode plates.

9. The organic EL display panel of claim 1, wherein
the first organic functional layer and the second organic functional layer are one of a charge injection layer and a charge transport layer.

10. The organic EL display panel of claim 1, wherein
the first organic functional layer and the second organic functional layer are each an organic light-emitting layer.

11. An organic electroluminescence (EL) display panel, comprising:
a first electrode plate group including a plurality of first electrode plates corresponding to a first color arranged in a first predetermined line;
a second electrode plate group including a plurality of second electrode plates corresponding to a second color arranged in a second predetermined line adjacent to the first electrode plate group;
a third electrode plate group including a plurality of third electrode plates corresponding to a third color arranged in a third predetermined line adjacent to the second electrode plate group;
a first bank along an edge of the first electrode plate group opposite the second electrode plate group;
a second bank between the first electrode plate group and the second electrode plate group along respective edges thereof;
a third bank along an edge of the second electrode plate group opposite the first electrode plate group;
a fourth bank along an edge of the third electrode plate group opposite the second electrode plate group;
a first organic functional layer between the first bank and the second bank and above the first electrode plate group;
a second organic functional layer between the second bank and the third bank and above the second electrode plate group;
a third organic functional layer between the third bank and the fourth bank and above the third electrode plate group;
a counter electrode disposed to cover the first organic functional layer, the second organic functional layer, and the third organic functional layer;
a thin-film transistor (TFT) layer provided below the first electrode plate group, the second electrode plate group, and the third electrode plate group;
an interlayer insulation film layered between (i) the first electrode plate group, the second electrode plate group, and the third electrode plate group, and (ii) the TFT layer; and
a plurality of contact holes penetrating through the interlayer insulation film and having wiring lines connecting the first electrode plates, the second electrode plates, and the third electrode plates with the TFT layer, wherein the first electrode plates, the second electrode plates, and the third electrode plates each have at least one concavities that coincide with the contact holes, a total volume of the at least one concavity in any of the first electrode plates is larger than a total volume of the at least one concavity in any of the second electrode plates and a total volume of the at least one concavity in any of the third electrode plates, a volume of a portion of the first organic functional layer corresponding to any of the first electrode plates at least approximates a volume of a portion of the second organic functional layer corresponding to any of the second electrode plates and to a volume of a portion of the third organic functional layer corresponding to any of the third electrode plates, and a portion of the first organic functional layer entered into the at least one concavity in any of the first electrode plates is larger than a portion of the second organic functional layer entered into the at least one concavity in any of the second electrode plates and larger than a portion of the third organic functional layer entered into the at least one concavity in any of the third electrode plates, so that in locations other than the at least one concavity in the first electrode plates, the second electrode plates, and the third electrode plates, the first organic functional layer is thinner than the second organic functional layer and the third organic functional layer.

12. The organic EL display panel of claim 1, wherein the first color is blue.

13. The organic EL display panel of claim 11, wherein the third organic functional layer comprises one of a charge injection layer and a charge transport layer.

14. The organic EL display panel of claim 11, wherein the third organic functional layer comprises an organic light-emitting layer.

15. The organic EL display panel of claim 1, wherein the electrode plates comprise anodes, and the counter electrode comprises a cathode.

16. The organic EL display panel of claim 1, wherein the electrode plates comprise cathodes, and the counter electrode comprises an anode.

17. A display device provided with the organic EL display panel of claim 1.

18. An organic electroluminescence (EL) display panel, comprising:
- a first electrode plate group including a plurality of first electrode plates corresponding to a first color arranged in a first predetermined line;
- a second electrode plate group including a plurality of second electrode plates corresponding to a second color arranged in a second predetermined line adjacent to the first electrode plate group;
- a first bank along an edge of the first electrode plate group opposite the second electrode plate group;
- a second bank between the first electrode plate group and the second electrode plate group along respective edges thereof;
- a third bank along an edge of the second electrode plate group opposite the first electrode plate group;
- a first organic functional layer between the first bank and the second bank and above the first electrode plate group;
- a second organic functional layer between the second bank and the third bank and above the second electrode plate group;
- a counter electrode disposed to cover both the first organic functional layer and the second organic functional layer,
- a thin-film transistor (TFT) layer provided below the first electrode plate group;
- an interlayer insulation film layered between the first electrode plate group and the TFT layer; and
- a contact hole that penetrates through the interlayer insulation film and has a wiring line connecting the first electrode plate group with the TFT layer, wherein each of the first electrode plates includes a concavity, the concavity included in each of the first electrode plates coincides with the contact hole, a volume of the first organic functional layer on any of the first electrode plates at least approximates a volume of the second organic functional layer on any of the second electrode plates, and a portion of the first organic functional layer has entered into the concavity in each of the first electrode plates, so that in locations other than the concavity, the first organic functional layer on the first electrode plates is thinner than the second organic functional layer on the second electrode plates.

* * * * *